United States Patent
Harada et al.

(10) Patent No.: US 10,290,492 B2
(45) Date of Patent: May 14, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Katsuyoshi Harada, Toyama (JP); Yushin Takasawa, Toyama (JP); Satoshi Shimamoto, Toyama (JP); Hiroki Hatta, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/463,243

(22) Filed: Mar. 20, 2017

(65) Prior Publication Data

US 2017/0345645 A1     Nov. 30, 2017

(30) Foreign Application Priority Data

May 31, 2016   (JP) ................................ 2016-108627

(51) Int. Cl.
*H01L 21/768* (2006.01)
*H01L 21/02* (2006.01)
(Continued)

(52) U.S. Cl.
CPC ...... *H01L 21/02164* (2013.01); *C23C 16/401* (2013.01); *C23C 16/455* (2013.01);
(Continued)

(58) Field of Classification Search
CPC ......... H01L 21/02164; H01L 21/02238; C23C 16/45557; C23C 16/45523; C23C 16/401; C23C 16/455; C23C 16/52; C23C 16/46
See application file for complete search history.

(56) References Cited

U.S. PATENT DOCUMENTS 6,468,926 B1   10/2002   Irino et al.
6,821,566 B2   11/2004   Nakamura et al.
(Continued)

FOREIGN PATENT DOCUMENTS

JP   H11-067747 A   3/1999
JP   2000-223488 A   8/2000
(Continued)

OTHER PUBLICATIONS

Korean Office Action dated Sep. 18, 2018 for the Korean Patent Application No. 10-2017-0063563.

*Primary Examiner* — Moin M Rahman
(74) *Attorney, Agent, or Firm* — Volpe and Koenig, P.C.

(57) ABSTRACT

A method of manufacturing a semiconductor device, includes forming a film containing a predetermined element on a substrate by supplying a precursor containing the predetermined element to the substrate having a first temperature in a process chamber, changing a temperature of the substrate to a second temperature higher than the first temperature under an atmosphere containing a first oxygen-containing gas in the process chamber, and oxidizing the film while maintaining the temperature of the substrate at the second temperature under an atmosphere containing a second oxygen-containing gas in the process chamber.

18 Claims, 8 Drawing Sheets

(51) Int. Cl.
*C23C 16/455* (2006.01)
*C23C 16/46* (2006.01)
*C23C 16/52* (2006.01)
*C23C 16/40* (2006.01)

(52) U.S. Cl.
CPC .. *C23C 16/45523* (2013.01); *C23C 16/45557* (2013.01); *C23C 16/46* (2013.01); *C23C 16/52* (2013.01); *H01L 21/02238* (2013.01); *H01L 21/02255* (2013.01)

(56) References Cited

U.S. PATENT DOCUMENTS

| | | | |
|---|---|---|---|
| 2003/0068437 A1* | 4/2003 | Nakamura | C23C 16/308 427/255.27 |
| 2005/0056220 A1 | 3/2005 | Aoki et al. | |
| 2007/0167030 A1 | 7/2007 | Jee et al. | |
| 2008/0124943 A1 | 5/2008 | Yuasa et al. | |
| 2010/0291763 A1* | 11/2010 | Ogawa | C23C 16/405 438/584 |
| 2015/0072537 A1* | 3/2015 | Noda | H01L 21/02126 438/786 |

FOREIGN PATENT DOCUMENTS

| | | |
|---|---|---|
| JP | 2001-148381 A | 5/2001 |
| JP | 2005-045220 A | 2/2005 |
| KR | 10-2000-0006527 A | 1/2000 |
| KR | 10-2001-0030252 A | 4/2001 |
| KR | 10-2007-0064392 A | 6/2007 |
| KR | 10-2009-0033923 A | 4/2009 |
| KR | 10-2010-0124210 A | 11/2010 |
| KR | 10-2015-0099501 A | 8/2015 |

* cited by examiner

Sample 2

Sample 1

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2016-108627, filed on May 31, 2016, the entire contents of which are incorporated herein by reference.

TECHNICAL FIELD

The present disclosure relates to a method of manufacturing a semiconductor device, a substrate processing apparatus, and a recording medium.

BACKGROUND

As one of processes of manufacturing a semiconductor device, a process of forming an oxide film containing a predetermined element such as silicon (Si) or the like on a substrate is often carried out.

SUMMARY

The present disclosure provides some embodiments of a technique capable of improving a quality of an oxide film formed on a substrate.

According to one embodiment of the present disclosure, there is provided a technique of manufacturing a semiconductor device, including forming a film containing a predetermined element on a substrate by supplying a precursor containing the predetermined element to the substrate having a first temperature in a process chamber, changing a temperature of the substrate to a second temperature higher than the first temperature under an atmosphere containing a first oxygen-containing gas in the process chamber, and oxidizing the film while maintaining the temperature of the substrate at the second temperature under an atmosphere containing a second oxygen-containing gas in the process chamber.

DETAILED DESCRIPTION

One Embodiment of the Present Disclosure

One embodiment of the present disclosure will now be described with reference to FIGS. 1 to 3.

(1) Configuration of the Substrate Processing Apparatus

Figure 1:
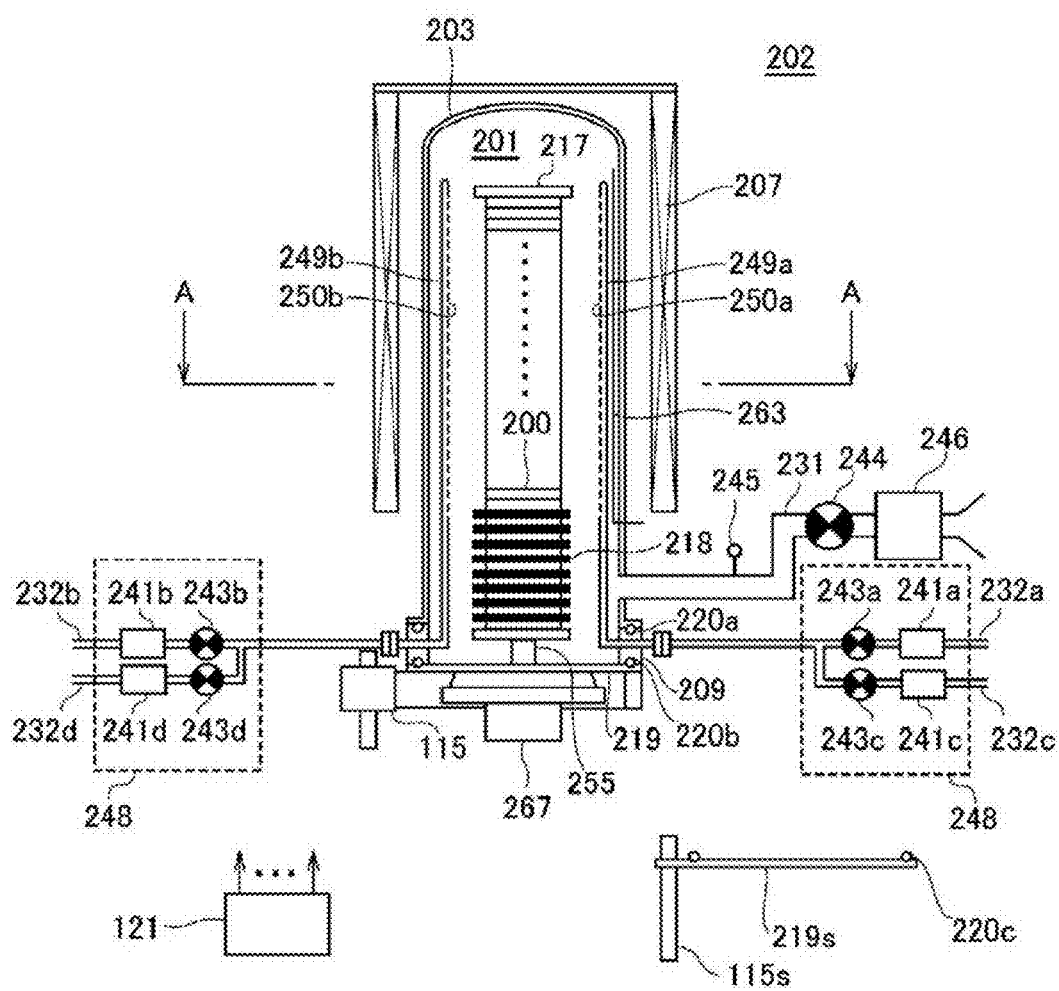
FIG. 1 is a schematic configuration diagram of a vertical processing furnace of a substrate processing apparatus suitably used in one embodiment of the present disclosure, in which a portion of the processing furnace is shown in a vertical cross sectional view.

As illustrated in FIG. 1, a processing furnace 202 includes a heater 207 as a heating mechanism (temperature adjustment part). The heater 207 has a cylindrical shape and is supported by a retaining plate so as to be vertically installed. The heater 207 functions as an activation mechanism (an excitation pan) configured to thermally activate (excite) a gas.

A reaction tube 203 is disposed inside the heater 207 to be concentric with the heater 207. The reaction tube 203 is made of a heat resistant material such as, e.g., quartz ($SiO_2$), silicon carbide (SiC) or the like and has a cylindrical shape with its upper end closed and its lower end opened. A manifold 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) is mainly configured by the reaction tube 203 and the manifold 209. A process chamber 201 is formed in a hollow cylindrical portion of the processing vessel. The process chamber 201 is configured to accommodate a plurality of wafers 200 as substrates.

Nozzles 249a and 249b are installed in the process chamber 201 so as to penetrate a sidewall of the manifold 209. Gas supply pipes 232a and 232b are respectively connected to the nozzles 249a and 249b.

Mass flow controllers (MFCs) 241a and 241b serving as flow rate controllers (flow rate control pans), and valves 243a and 243b serving as opening/closing valves, are installed in the gas supply pipes 232a and 232b sequentially from the corresponding upstream sides, respectively. Gas supply pipes 232c and 232d for supplying an inert gas, are respectively connected to the gas supply pipes 232a and 232b at the downstream side of the valves 243a and 243b. MFCs 241c and 241d, and valves 243c and 243d are respectively installed in the gas supply pipes 232c and 232d sequentially from the corresponding upstream sides.

Figure 2:
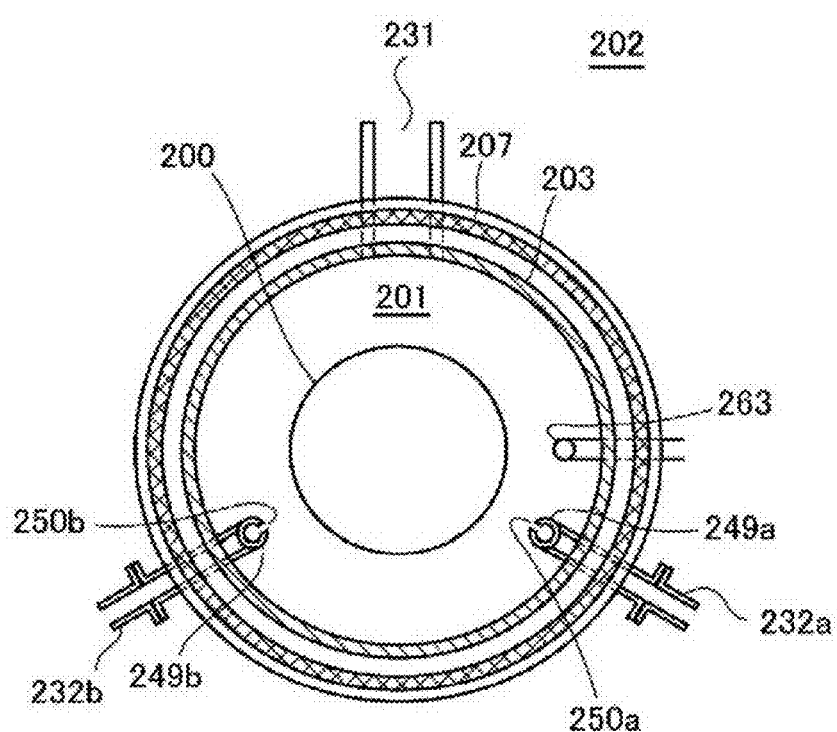
FIG. 2 is a schematic configuration diagram of the vertical processing furnace of the substrate processing apparatus suitably used in one embodiment of the present disclosure, in which a portion of the processing furnace is shown in a cross sectional view taken along line A-A in FIG. 1A.

As illustrated in FIG. 2, the nozzles 249a and 249b are disposed in a space with an annular plan-view shape between the inner wall of the reaction tube 203 and the wafers 200 such that the nozzles 249a and 249b are respectively installed to extend upward along a stacking direction of the wafers 200 from a lower portion of the inner wall of the reaction tube 203 to an upper portion of the inner wall of the reaction tube 203. Specifically, the nozzles 249a and 249b are respectively installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are respectively formed on the side surfaces of the nozzles 249a and 249b. Each of the gas supply holes 250a and 250b is opened toward the center of the reaction tube 203 so as to allow a gas to be supplied toward the wafers 200. The gas supply holes 250a and 250b may be formed in a plural number between the lower portion of the reaction tube 203 and the upper portion of the reaction tube 203.

A halosilane precursor gas which contains Si as a predetermined element (main element) and a halogen element, as a first precursor (precursor gas), is supplied from the gas supply pipe 232a into the process chamber 201 via the MFC 241a, the valve 243a and the nozzle 249a. The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. The halosilane refers to a silane having a halogen group. The halogen group includes a chloro group, a fluoro group, a bromo group, an iodine group, and the like. That is, the halogen group includes a halogen element such as chlorine (Cl), fluorine (F), bromine (Br), iodine (I) or the like. As the first precursor gas, for example, a chlorosilane precursor gas which contains Si and Cl may be used. As the chlorosilane precursor gas, for example, a dichlorosilane ($SiH_2Cl_2$, abbreviation: DCS) gas may be used.

A silane precursor gas which contains Si as a predetermined element (main element) and does not contain a halogen element, as a second precursor (precursor gas), is supplied from the gas supply pipe 232b into the process chamber 201 via the MFC 241b, the valve 243b and the nozzle 249b. As the second precursor gas, for example, a silicon hydride gas may be used. As the silicon hydride gas, for example, a disilane ($Si_2H_6$, abbreviation: DS) gas may be used.

An oxygen (O)-containing gas is supplied from the gas supply pipe 232a into the process chamber 201 via the MFC 241a, the valve 243a and the nozzle 249a. In the present disclosure, the O-containing gas supplied at a temperature rising step to be described later will also be referred to as a first O-containing gas, and the O-containing gas supplied at an oxidation step to be described later will also be referred to as a second O-containing gas. When a silicon film (Si film) formed on the wafer 200 is heated, the first O-containing gas suppresses the movement (migration) of Si contained in the Si film and suppresses the desorption (thermal etching) of Si from the Si film. The second O-containing gas acts as an oxidizing gas, i.e., an O source, for oxidizing the entire Si film (i.e., the entire portion of the Si film) formed on the wafer 200. As the first and second O-containing gases, for example, an oxygen ($O_2$) gas may be used.

A hydrogen (H)-containing gas is supplied from the gas supply pipe 232b into the process chamber 201 via the MFC 241b, the valve 243b and the nozzle 249b. The H-containing gas does not obtain an oxidizing action by itself, but generates oxidizing species such as atomic oxygen (O) or the like by reacting with the O-containing gas under a specific condition and to enhance the efficiency of the oxidization process. Therefore, similar to the O-containing gas, the H-containing gas may be considered as being included in the oxidizing gas. As the H-containing gas, for example, a hydrogen ($H_2$) gas may be used.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b, and the nozzles 249a and 249b, respectively.

A first precursor (precursor gas) supply system is mainly configured by the gas supply pipe 232a, the MFC 241a, and the valve 243a. A second precursor (precursor gas) supply system is mainly configured by the gas supply pipe 232b, the MFC 241b, and the valve 243b. First and second O-containing gas supply systems are mainly configured by the gas supply pipe 232a, the MFC 241a, and the valve 243a. An H-containing gas supply system is mainly configured by the gas supply pipe 232b, the MFC 241b, and the valve 243b. An inert gas supply system is mainly configured by the gas supply pipes 232c and 232d, the MFCs 241c and 241d, and the valves 243c and 243d.

Any or all of the various supply systems mentioned above may be configured as an integrated supply system 248 formed by integrating the valves 243a to 243d, the MFCs 241a to 241d and the like. The integrated supply system 248 is connected to each of the gas supply pipes 232a to 232d. The integrated supply system 248 is configured such that the supply operation of various kinds of gases to the gas supply pipes 232a to 232d, i.e., the opening/closing operation of the valves 243a to 243d, the flow rate adjusting operation by the MFCs 241a to 241d or the like, is controlled by a controller 121 which will be described later. The integrated supply system 248 is configured as an integral type or division type integrated unit and can be attached to or detached from the gas supply pipes 232a to 232d and the like on an integrated unit basis so that the maintenance, exchange, expansion and the like of the supply systems can be performed on an integrated unit basis.

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that the vacuum exhaust of the interior of the process chamber 201 and the vacuum exhaust stop can be performed by opening and closing the APC valve 243 while operating the vacuum pump 246. Further, the APC valve 244 is configured so that the internal pressure of the process chamber 201 can be adjusted by adjusting the opening degree of the APC valve 243 based on the pressure information detected by the pressure sensor 245 while operating the vacuum pump 246. An exhaust system is mainly configured by the exhaust pipe 231, the APC valve 244 and the pressure sensor 245. The vacuum pump 246 may be included in the exhaust system.

A seal cap 219, which serves as a furnace opening cover configured to hermetically seal a lower end opening of the manifold 209, is installed under the manifold 209. The seal cap 219 is made of metal such as, e.g., stainless steel or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219s is installed under the manifold 209. The shutter 219s serves as a furnace opening cover capable of hermetically sealing the lower end opening of the manifold 209 while the seal cap 219 is moved down with the boat elevator 115. The shutter 219s is made of metal such as, e.g., stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a beat resistant material such as, e.g., quartz or SiC, are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
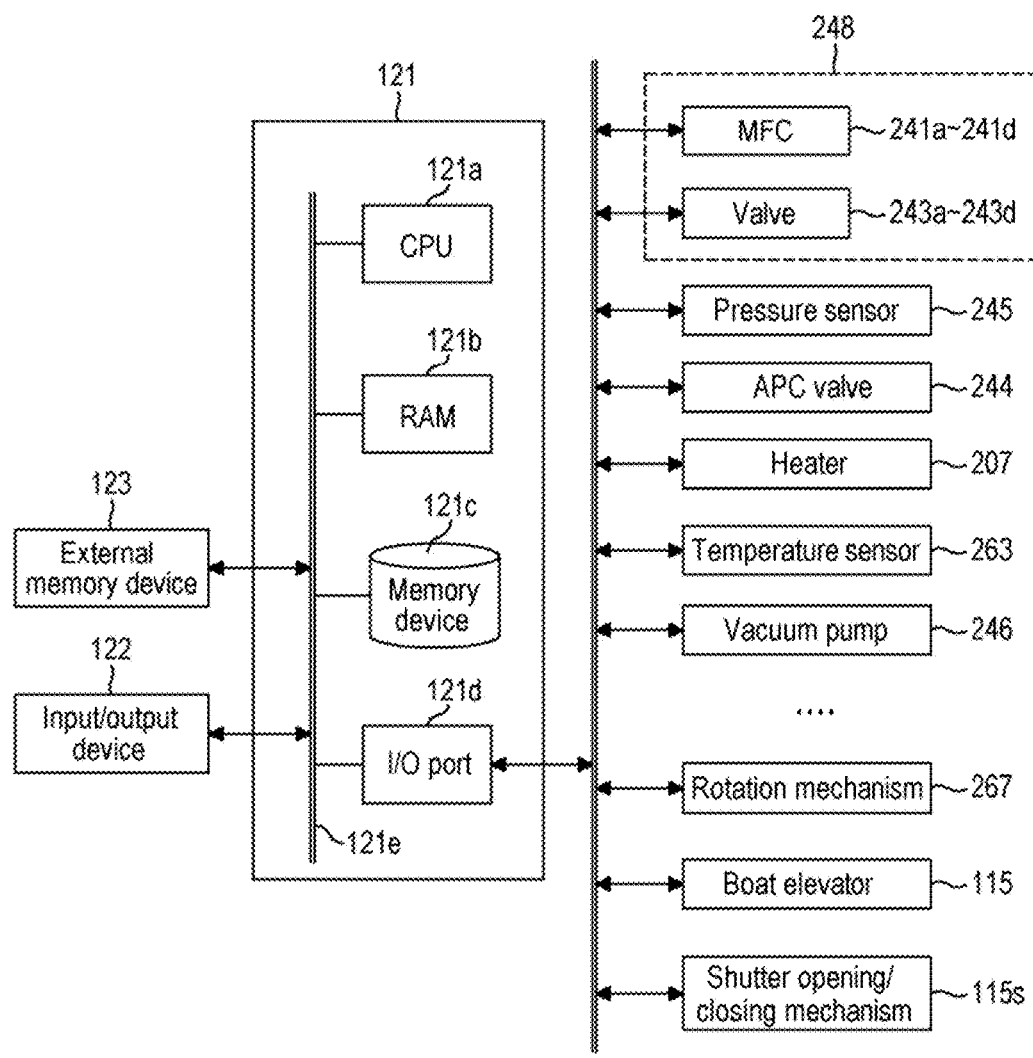
FIG. 3 is a schematic configuration diagram of a controller of the substrate processing apparatus suitably used in one embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling operations of a substrate processing apparatus, a process recipe for specifying procedures and conditions of substrate processing to be described later, or the like is readably stored in the memory device 121c. The process recipe functions as a program for causing the controller 121 to execute each sequence in a substrate processing process, to be described later, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, the shutter opening/closing mechanism 115s, and the like, as mentioned above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation of the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123 (for example, a magnetic disc such as a hard disc, an optical disc such as a CD, a magneto-optical disc such as an MO, or a semiconductor memory such as a USB memory). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing Process

An example of a substrate processing sequence of forming a silicon oxide (SiO) film on a wafer 200 as a substrate using the aforementioned substrate processing apparatus, which is one of the processes for manufacturing a semiconductor device, will be described with reference to FIGS. 4 to 6. In the following descriptions, the operations of the respective parts constituting the substrate processing apparatus are controlled by the controller 121.

Figure 5A:
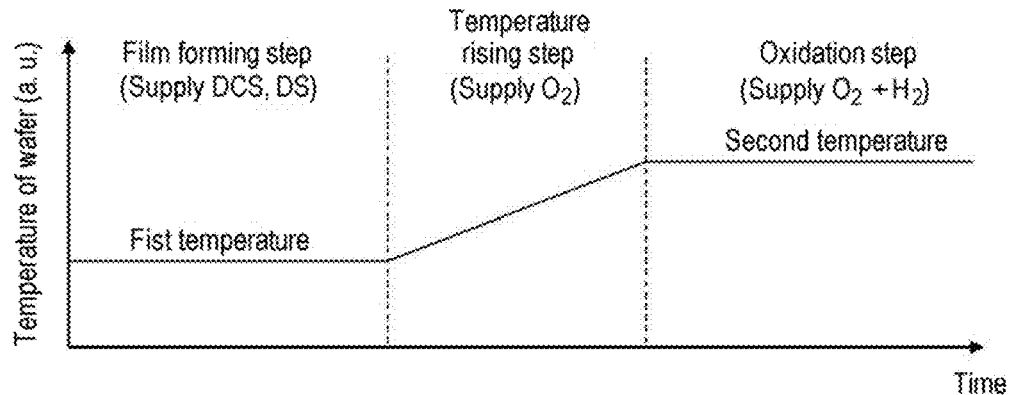
FIG. 5A is a diagram illustrating a substrate processing sequence according to one embodiment of the present disclosure.

In the film forming sequence illustrated in FIG. 5, there are performed in a same process chamber 201: a film forming step of forming an Si film on the wafer 200 by supplying a DCS gas and a DS gas to the wafer 200 having a first temperature, a temperature rising step of changing a temperature of the wafer 200 to a second temperature higher than the first temperature under an atmosphere containing an $O_2$ gas, and an oxidation step of oxidizing the Si film while maintaining the temperature of the wafer 200 at the second temperature.

Figure 4:
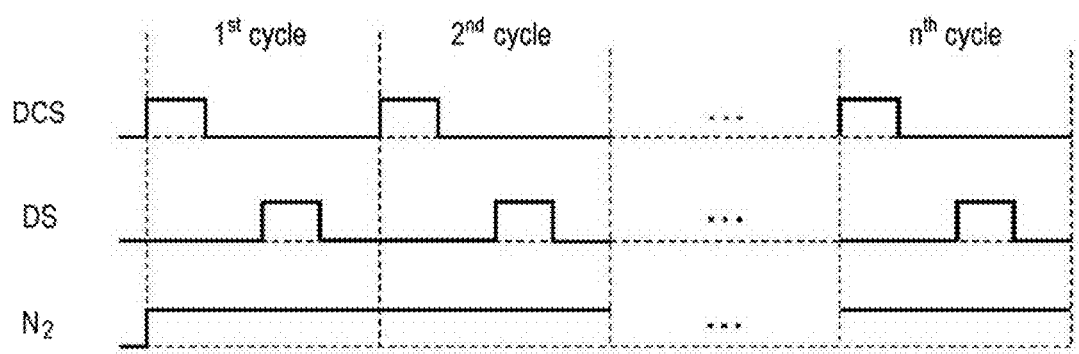
FIG. 4 is a diagram illustrating a gas supply sequence of a film forming step according to one embodiment of the present disclosure.

At the film forming step as mentioned above, as in the gas supply timing illustrated in FIG. 4, the Si film is formed on the wafer 200 by implementing, a predetermined number of times, a cycle which alternately performs a step (1) of supplying a DCS gas to the wafer and a step (2) of supplying a DS gas to the wafer 200.

When the term "wafer" is used herein, it may refer to "a wafer itself" or "a laminated body of a wafer and a predetermined layer or film formed on the surface of the wafer". In addition, when the phrase "a surface of a wafer" is used herein, it may refer to "a surface of a wafer itself" or "a surface of a predetermined layer or film formed on a wafer. In the present disclosure, the expression "a predetermined layer is formed on a wafer" may mean that "a predetermined layer is directly formed on a surface of a wafer itself" or that "a predetermined layer is formed on a layer formed on a wafer, namely on an uppermost surface of a wafer as a laminated body." In addition, when the term "substrate" is used herein, it may be synonymous with the term "wafer."

(Wafer Charging and Boat Loading)

A plurality of wafers 200 are charged onto the boat 217 (wafer charging), the shutter 219s is moved to open the lower end opening of the manifold 209 (shutter opening). Thereafter, as illustrated in FIG. 1, the boat 217 supporting the plurality of wafers 200 is loaded into the process chamber 201 (boat loading). In this state, the seal cap 219 seals the lower end of the manifold 209 via the O-ring 220b.

As the wafer 200, an Si substrate may be used. The Si substrate may be formed of, for example, single crystal Si or a substrate in which a single crystal Si film is formed on its surface. The single crystal Si is exposed to the surface of the wafer 200. An insulating film such as, e.g., an SiO film, a silicon nitride film (SiN film), a silicon oxynitride film (SiON film) or the like may be formed in a portion of the surface of the wafer 200.

Before the wafer 200 is loaded into the process chamber 201, the surface of the wafer 200 is cleaned in advance with hydrogen fluoride (HF) or the like. The surface of the wafer 200 may be temporarily exposed to the air until the wafer 200 is loaded into the process chamber 201 after the cleaning process. In such a case, a natural oxide film (SiO film) may be formed in at least a portion of the surface of the wafer 200 loaded into the process chamber 201. The natural oxide film may be formed to sparsely (in an island shape) cover the surface of the wafer 200, namely a portion of the exposed single crystal Si, or may be formed to continuously (in a non-island shape) cover the whole area of the exposed single crystal Si.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. Further, the rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Film Forming Step)

Thereafter, the following two steps 1 and 2, are sequentially performed.

[Step 1]

At this step, a DCS gas is supplied to the wafer 200. Specifically, the valve 243a is opened to allow a DCS gas to flow through the gas supply pipe 232a. The flow rate of the DCS gas is adjusted by the MFC 241a. The DCS gas is supplied into the process chamber 201 via the nozzle 249a and is exhausted from the exhaust pipe 231. At this time, the DCS gas is supplied to the wafer 200. Simultaneously, the valve 243c is opened to allow an $N_2$ gas to flow through the gas supply pipe 232c. The $N_7$ gas is supplied into the process chamber 201 together with the DCS gas and is exhausted from the exhaust pipe 231. Furthermore, in order to prevent the DCS gas from entering the nozzle 249b, the valve 243d is opened to allow the $N_2$ gas to flow through the gas supply pipe 232d. The $N_2$ gas is supplied into the process chamber 201 via the gas supply pipe 232b and the nozzle 249b and is exhausted from the exhaust pipe 231.

By supplying the DCS gas to the wafer 200, it is possible to generate the treatment effect by the DCS and progress the following process. That is, by supplying the DCS containing Cl having high electronegativity to the surface of the wafer 200, an Si—O bond contained in the natural oxide film can be broken by bringing O of the natural oxide film formed on the surface of the wafer 200 into contact with Cl of the DCS. In other words, the Si—O bond terminating the surface of the single crystal Si can be broken by the polarity of the DCS. Furthermore, the Si—O bond terminating the surface of the single crystal Si can be broken by an extremely small amount of Cl– (Cl ion) generated from being separated from the DCS. That is, a dangling bond of Si can be generated on the surface of the single crystal Si. This may provide a better environment in which a homo-epitaxial growth to be described later is likely to proceed. In addition, as the aforementioned reaction goes ahead on the surface of the wafer 200, the natural oxide film formed on the surface is removed so that the surface of the single crystal Si is exposed. As described above, the DCS gas acts as a cleaning gas for removing the natural oxide film from the surface of the single crystal Si. When the SiO film or the like is formed on the surface of the wafer 200, an adsorption site of Si is formed on the surface of the SiO film or the like by the aforementioned treatment effect.

If the environment in which the homo-epitaxial growth is likely to proceed on the surface of the wafer 200 is established by the aforementioned treatment effect, the valve 243a is closed to stop the supply of the DCS gas. At this time, the interior of the process chamber 201 is vacuum-exhausted by the vacuum pump 246 while opening the APC valve 244. Thus, the unreacted gas or the gas contributed to the aforementioned reaction, which remains within the process chamber 201, is removed from the interior of the process chamber 201. At this time, the supply of the $N_2$ gas into the process chamber 201 is maintained while opening the valves 243c and 243d. The $N_2$ gas acts as a purge gas.

[Step 2]

After step 1 is completed, a DS gas is supplied to the wafer 200. At this step, the opening/closing control of the valves 243b to 243d is performed in the same procedure as the opening/closing control of the valves 243a, 243c, and 243d performed at step 1 to allow a DS gas to flow through the gas supply pipe 232b. The flow rate of the DS gas flowing through the gas supply pipe 232b is adjusted by the MFC 241b. The DS gas is supplied into the process chamber 201 via the nozzle 249b and is exhausted from the exhaust pipe 231. At this time, the DS gas is supplied to the wafer 200.

By supplying the DS gas to the wafer 200, it is possible to grow the Si layer on the surface of the wafer 200. That is, Si contained in the DS can be bonded to the dangling bond of Si formed by performing step 1 to form a nucleus of an Si crystal on the surface of the wafer 200 and to gas-phase epitaxially grow the Si crystal. This growth is a homo-epitaxial growth. In the homo-epitaxial growth, since the crystal having the same lattice constant and made of the same material is grown in the same crystal direction on the underlying crystal, it is possible to obtain a less-defective high quality crystal. By performing the above process, an Si layer formed of the Si single crystal is formed on the surface of the wafer 200. In the case where an SiO film or the like is formed on the surface of the wafer 200, Si contained in the DS can be adsorbed to the adsorption site of Si formed on the surface of the SiO film or the like by the aforementioned treatment effect. In this case, amorphous, polycrystal, or an Si film in a mixed crystal state of amorphous and polycrystal is formed on the SiO film.

When the formation of the Si layer is completed, the valve 243b is closed to stop the supply of the DS gas. Then, the unreacted gas, the gas contributed to the aforementioned reaction, or the reaction byproduct, which remains within the process chamber 201, is excluded from the interior of the process chamber 201 according to the same processing procedures as those of step 1.

When step 2 is performed, at least a portion of the surface of the Si layer may be terminated by an Si—H bond contained in the DS gas. The Si—H bond terminating the surface of the Si layer can be broken by supplying the DCS gas to the wafer 200 at next step 1. That is, the Si—H bond terminating the surface of the Si layer can be broken by an extremely small amount of Cl generated from being separated from the DCS. This makes it possible to form the dangling bond of Si on the surface of the Si layer and to again establish an environment in which the homo-epitaxial growth is likely to proceed. Thus, the formation of the Si layer described above can begin without delay at next step 2.

In addition, when step 2 is performed, there may be a case where Si is abnormally grown on the surface of the wafer 200. For example, when step 2 is performed, Si adsorbed to the surface of the wafer 200 may locally cohere (or aggregate) to form an uneven structure on the surface of the Si layer. The abnormally grown Si can be removed by supplying the DCS gas to the wafer 200 at next step 1. That is, an Si—Si bond contained in the abnormally grown Si can be broken and the abnormally grown Si can be etched by an extremely small amount of Cl⁻ generated from being separated from the DCS. This makes it possible to smooth the surface of the Si layer, and as a result, the surface roughness or the like of the finally-formed Si film can be improved. Here, the term "surface roughness" refers to a difference in height (having the same meaning as that of surface roughness) of a film within the wafer surface, and indicates that the smaller the value, the more the surface is smoothed. In other words, the improvement in the surface roughness means that the height difference of a film is reduced to improve the smoothness of the surface.

The effects mentioned herein may be considered as being included in the treatment effect by the DCS.

(Performing a Predetermined Number of Times)

A cycle which alternately, i.e., non-synchronously and non-simultaneously, performs steps 1 and 2 described above is implemented a predetermined number of times (n times) (where n is an integer of 1 or more). Thus, an Si film can be formed on the surface of the wafer 200.

The Si film is formed by epitaxially growing an Si crystal using the Si layer formed on the surface of the wafer 200 as a base. The crystal structure of the Si film is a single crystal inheriting the crystallinity of the base. That is, the Si film is a single crystal Si film (epitaxial Si film) formed of the same material as that of the underlying single crystal Si and having the same lattice constant and the same crystal direction. When the Si film is formed, by allowing the aforementioned treatment effect to be appropriately exhibited, it is possible to form the SiO film finally obtained by oxidizing the Si film as a dense film with less pin hole or film damage (hereinafter, generally referred to as film damage or the like), and to form a film with high resistance (etching resistance) to HF. Furthermore, the term "pin hole" refers to a path along which an etchant such as an etching gas or an etching solution enters toward a base side of a film when the etchant is supplied to the film. In addition, the term "film damage" refers to, for example, a defect occurring on a scale greater than that of a pin hole. The film damage or the like may easily occur particularly when a film has a small thickness. Thus, it can be said that the technical significance of generating the treatment effect is increased particularly when the thickness of the finally formed SiO film is reduced or when the processing resistance such as the etching resistance to the finally formed SiO film is required.

Hereinafter, the processing conditions of the film forming step will be described. The conditions described herein are also the ones under which the aforementioned treatment effect can be appropriately exhibited.

The supply flow rate of each of the DCS gas and the DS gas may be set at a flow rate which falls within a range of, for example, 10 to 1,000 sccm. The supply time period of each of the DCS gas and the DS gas may be set at a time period which falls within a range of, for example, 1 to 600 seconds. The supply flow rate of the $N_2$ gas supplied from each gas supply pipe may be set at a flow rate which falls within a range of, for example, 0 to 10,000 sccm. By not supplying the $N_2$ gas, it becomes possible to increase the partial pressure of each precursor gas and to change the quality of a layer.

The temperature (first temperature) $T_1$ of the wafer 200 may be set at a temperature which falls within a range of, for example, 250 to 600 degrees C., specifically 350 to 450 degrees C. The internal pressure (first pressure) $P_1$ of the process chamber 201 may be set at a pressure which falls within a range of, for example, 0.1 to 20 Torr (13.3 to 2,660 Pa).

If $T_1$ is less than 250 degrees C. or $P_1$ is less than 0.1 Torr, there may be a case where the amount of Cl⁻ or DCS supplied to the wafer 200 at step 1 is too insufficient to obtain the aforementioned treatment effect. Furthermore, there may also be a case where the DS supplied to the wafer 200 at step 2 is hard to be decomposed, which makes it difficult to form the Si layer on the wafer 200. By setting $T_1$ to become 250 degrees C. or higher or $P_1$ to become 0.1 Pa or more, it is possible to solve these problems and to form the Si film at a practical deposition rate. By setting $T_1$ to become 350 degrees C. or higher, it is possible to more reliably solve these problems and to further increase the deposition rate of the Si film.

If $T_1$ exceeds 600 degrees C. or $P_1$ exceeds 20 Torr, there may be a case where Si contained in the DCS is deposited on the wafer 200 at step 1. In this case, Si is deposited before the natural oxide film is removed from the surface of the single crystal Si. Thus, the epitaxial growth does not go ahead on the single crystal Si (on the natural oxide film) and an amorphous Si film or a poly-Si film may be grown thereon. Furthermore, there may also be a case where the aforementioned treatment effect using the polarity of the DCS or the like is not obtained. In addition, an excessive gas phase reaction may occur at step 2. Thus, the thickness uniformity or the step coverage of the Si layer is likely to be deteriorated. Moreover, the amount of particle generated within the process chamber 201 may be increased. By setting $T_1$ at 600 degrees C. or lower or $P_1$ at 20 Torr or less, it is possible to solve these problems and to form a high quality epitaxial Si film with the excellent in-plane film thickness uniformity or step coverage on the wafer 200. By setting $T_1$ at 450 degrees C. or lower, it is possible to more reliably solve these problems and to further improve the quality of the Si film.

As the first precursor gas, it may be possible to use, in addition to the DCS gas, a chlorosilane precursor gas such as a monochlorosilane ($SiH_3Cl$, abbreviation: MCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like. In order to promote the brokenness reaction of the Si—O bond while suppressing the deposition of Si on the wafer 200 at step 1, as the first precursor gas, it is desirable to use a halosilane precursor gas having less Si and more Cl contained in one molecule in number. In addition, in order to appropriately suppress the brokenness reaction of the Si—O bond at step 1, it is desirable to use a halosilane precursor gas having less Cl contained in one molecule in number.

As the second precursor gas, it may be possible to use, in addition to the DS gas, a silicon hydride gas, such as a monosilane ($SiH_4$, abbreviation: MS) gas, a trisilane ($Si_3H_8$) gas, a tetrasilane ($Si_4H_{10}$) gas, a pentasilane ($Si_5H_{12}$) gas, a hexasilane ($Si_6H_{14}$) gas or the like, i.e., a silane precursor gas not containing a halogen element.

As the inert gas, it may be possible to use, in addition to the $N_2$ gas, a rare gas such as, for example, an Ar gas, an He gas, an Ne gas, a Xe gas or the like.

(First after Purge)

After the formation of the Si film is completed, an $N_2$ gas is supplied from each of the gas supply pipes 232c and 232d into the process chamber 201 200 and is exhausted from the exhaust pipe 231. Thus, the interior of the process chamber 201 is purged with the inert gas, and the gas or the reaction byproduct, which remains within the process chamber 201, is removed from the interior of the process chamber 201 (first after purge). By performing the first after purge, a gas phase reaction occurs within the process chamber 201 when an $O_2$ gas is supplied into the process chamber 201 at a temperature rising step to be described later, thereby suppressing the generation of particle.

(Temperature Rising Step)

When the purge within the process chamber 201 is completed, the temperature of the wafer 200 is changed to a second temperature $T_2$ higher than the first temperature $T_1$ described above in a preliminary preparation prior to performing an oxidation step to be described later is performed. At the subsequent oxidation step, in order to appropriately perform an oxidation process using an $O_2$ gas and an $H_2$ gas and also in order to reduce a surface electron trap density (interface level density) between a finally formed SiO film and the wafer 200, it is necessary to increase the temperature of the wafer 200 to a temperature which falls within a range of, for example, 700 to 1,000 degrees C., specifically 700 to 900 degrees C.

Figure 6A:
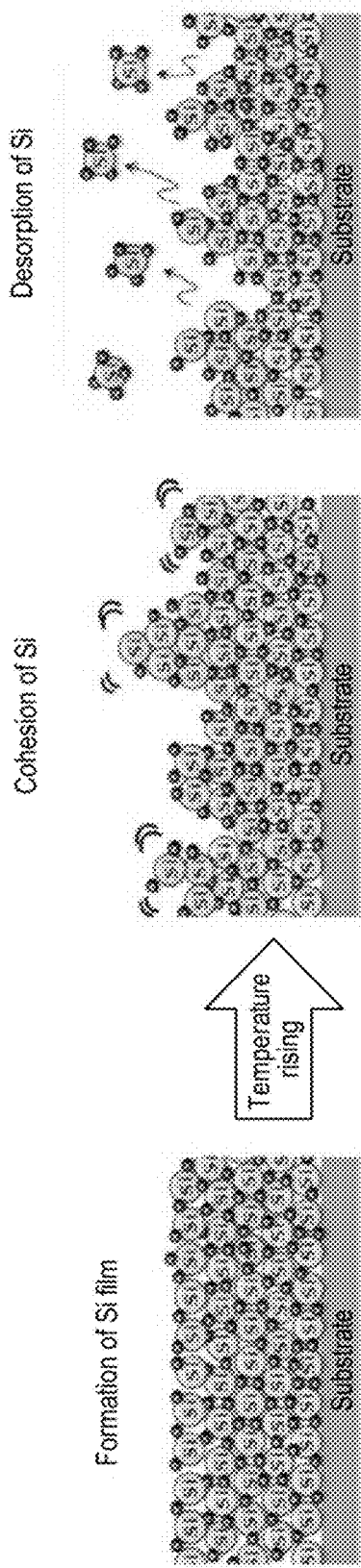
FIG. 6A is a view illustrating a state in which Si contained in an Si film migrates to cohere or is desorbed from the Si film.

The temperature condition mentioned herein is a temperature at which at least one of a migration of Si contained in the Si film formed on the wafer 200 and thermal etching of the Si film may remarkably occur under an atmosphere not containing O. In FIG. 6A, there is shown a state in which Si forming the Si film migrates to cohere or the surface of the Si film is thermally etched to allow Si to be desorbed when the Si film formed on the substrate is heated to a temperature of 700 degrees C. or higher. These phenomena bring about an uneven structure on the surface of the finally formed SiO film and degrade its surface roughness.

Thus, in the present embodiment, the temperature rising step is performed under an atmosphere containing an $O_2$ gas so as to suppress the occurrence of those phenomena. Specifically, the temperature of the wafer 200 starts to rise, and the opening/closing control of the valves 243a, 243c, and 243d is performed in the same procedure as the opening/closing control of the valves 243a, 243c, and 243d at step 1 as described above, to allow the $O_2$ gas to flow through the gas supply pipe 232a. The flow rate of the $O_2$ gas flowing through the gas supply pipe 232a is adjusted by the MFC 241a. The $O_2$ gas is supplied into the process chamber 201 via the nozzle 249a and is exhausted from the exhaust pipe 231. At this time, the $O_2$ gas is supplied to the wafer 200. The supply of the $O_2$ gas to the wafer 200 may start before or after the temperature of the wafer 200 starts to rise.

Figure 6B:
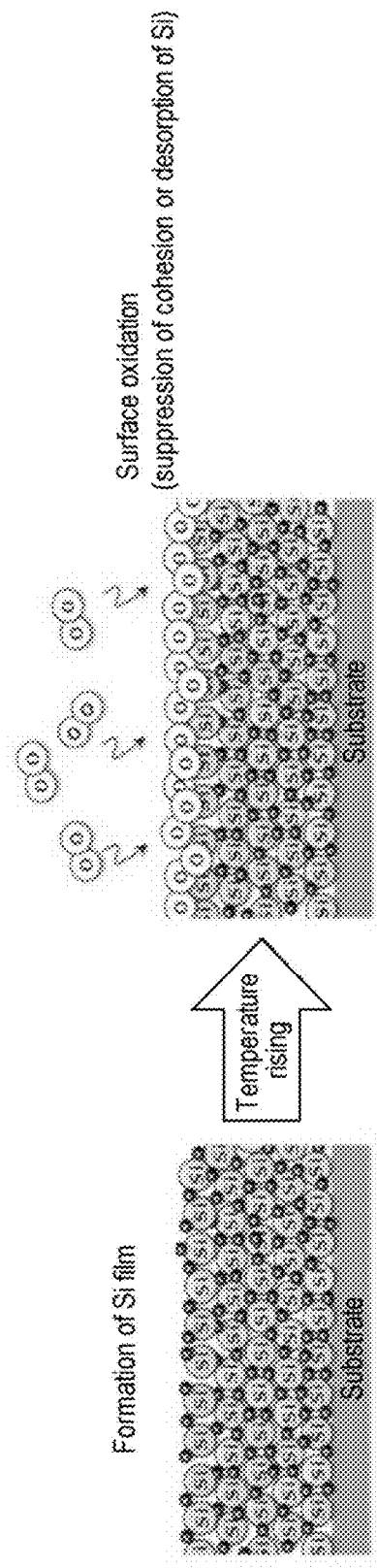
FIG. 6B is a view illustrating a state in which the cohesion or desorption of Si is suppressed as the surface of the Si film is oxidized.

By performing the temperature rising step under the atmosphere containing the $O_2$ gas, the surface of the Si film formed on the wafer 200 can be oxidized and modified (changed) to a silicon oxide layer (SiO layer). Thus, it is possible to suppress the cohesion or desorption of Si which degrades the surface roughness. O bonded to Si on the surface of the Si film may act as a factor hindering the cohesion or desorption of Si. In FIG. 6B, there is shown a state in which the surface of the Si film is oxidized to suppress the cohesion or desorption of Si when the Si film formed on the substrate is heated to a temperature of 700 degrees C. or higher under the atmosphere of the $O_2$ gas. In this manner, by oxidizing the surface of the Si film, it is possible to avoid the degradation of the surface roughness of the finally formed SiO film.

Figure 5B:
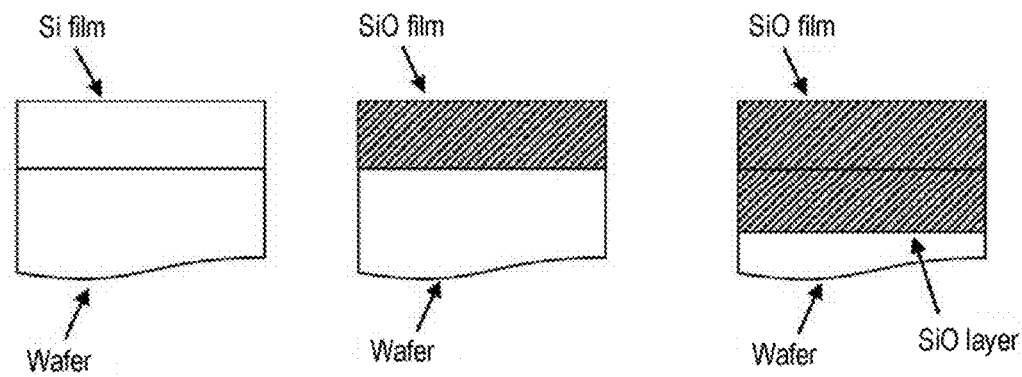
FIGS. 5B and 5C are views illustrating a cross sectional structure of a wafer surface after a film forming step, a temperature rising step, and an oxidation step are performed.
Figure 5C:
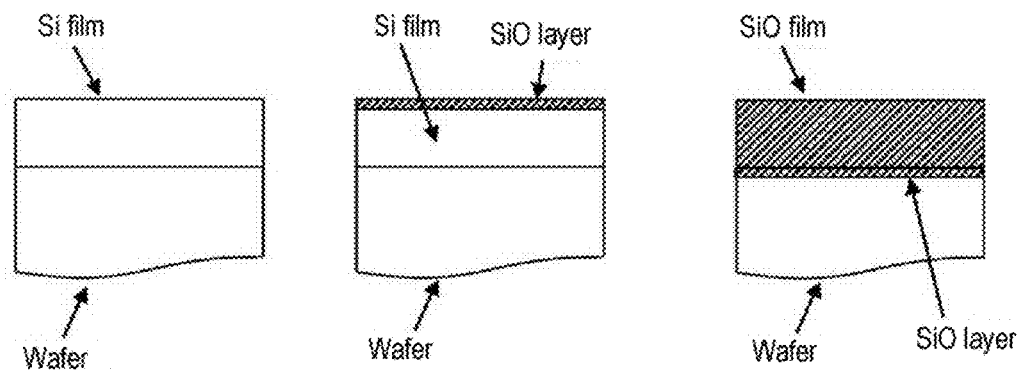

At the temperature rising step, it is desirable that the entire Si film be not oxidized and only the surface of the Si film be oxidized. As illustrated in FIG. 5B, in a case where the entire Si film is oxidized at the temperature rising step, when the oxidation step is performed thereafter, not only the surface of the underlying wafer 200 but also a wide area of a deeper layer than the surface may be oxidized. In contrast, as illustrated in FIG. 5C, in a case where only the surface of the Si film is oxidized at the temperature rising step, even when the oxidation step is performed thereafter, it is possible to only slightly oxidize the surface of the underlying wafer 200 in an oxidization amount. Furthermore, by slightly oxidizing the surface of the underlying wafer 200 when the oxidation step is performed, it is possible to reduce a surface electron trap density between the SiO film and the wafer 200, compared with the case of not oxidizing the surface of the wafer 200.

Hereinafter, the processing conditions of the temperature rising step will be described. The conditions described herein are the ones under which the cohesion or desorption of Si can be suppressed and the ones under which only the surface of the Si film, rather than the entire Si film, can be oxidized.

The supply flow rate (first flow rate) $F_1$ of the $O_2$ gas may be set at a flow rate which falls within a range of, for example, 10 to 10,000 sccm. In order to oxidize only the surface of Si at the temperature rising step, it is desirable that $F_1$ be set at a flow rate equal to or less than a supply flow rate (second flow rate) $F_2$ of the $O_2$ gas ($F_1 \leq F_2$) at the oxidization step which will be performed later, and it is more desirable that $F_1$ be set at a flow rate less than $F_2$ ($F_1 < F_2$). The supply flow rate of the $N_2$ gas supplied from each gas supply pipe may be set at a flow rate which falls within a range of, for example, 0 to 10,000 sccm.

The internal pressure (second pressure) $P_2$ of the process chamber 201 may be set at a pressure which falls within a range of, for example, 0.1 to 100 Torr (13.3 to 13,300 Pa). In order to suppress the thermal etching of the Si film at the temperature rising step, it is desirable that $P_2$ be set at a pressure higher than an internal pressure (third pressure) $P_3$ of the process chamber 201 ($P_2 > P_3$) at the oxidization step which will be performed later, and it is also desirable that $P_2$ be set at a pressure higher than $P_1$ mentioned above ($P_2 > P_1$).

At the temperature rising step, the Si film is oxidized from its uppermost surface to a depth of 0.05 to 1 nm, specifically 0.1 to 0.5 nm, more specifically 0.2 to 0.5 nm. If the depth is less than 0.05 nm, there may be a case where the cohesion or desorption of Si is not be suppressed when the temperature of the wafer 200 rises. In addition, when the oxidation step to be described later is performed, there may also be a case where the surface of the underlying wafer 200 may not be slightly oxidized or the surface electron trap density between the SiO film and the wafer 200 is increased. By setting the depth to become a depth of 0.05 nm or more, these problems can be solved. By setting the depth to become a depth of 0.1 nm or more, further, 0.2 nm or more, these problems can be more reliably solved. Furthermore, if the depth exceeds 1 nm, when the oxidation step is performed thereafter, the surface of the underlying wafer 200 may be extensively oxidized in a depth direction. By setting the depth at a depth of 1 nm or less, further, 0.5 nm or less, it is possible to suppress excessive oxidation of the wafer 200.

As the first O-containing gas, it may be possible to use, in addition to the $O_2$ gas, a gas containing nitrogen (N) such as a nitrous oxide ($N_2O$) gas, a nitrogen monoxide (NO) gas, a nitrogen dioxide ($NO_2$) gas or the like. This O-containing gas containing N is a gas having an oxidizing power lower than a second O-containing gas used at the oxidation step to be described later. Thus, it may be easy to oxidize only the surface of the Si film by using this gas as the first O-containing gas.

As the inert gas, it may be possible to use, in addition to the $N_2$ gas, for example, various kinds of rare gases mentioned above.

(Oxidation Step)

When the temperature of the wafer 200 reaches the aforementioned second temperature so as to be stabilized, the temperature of the wafer 200 is maintained at the second temperature under an atmosphere containing the $O_2$ gas and the entire Si film (hereinafter, also referred to simply as an "Si film") with the SiO layer formed on its surface is oxidized. Specifically, in a state in which the temperature of the wafer 200 is maintained at the second temperature by adjusting an output from the heater 207, the valves 243a and 243b are opened and the $O_2$ gas and the $H_2$ gas are separately supply into the process chamber 201. The $O_2$ gas and the $H_2$ gas are mixed and reacted within the process chamber 201 and are subsequently exhausted from the exhaust pipe 231. At this time, the valves 243c and 243d may be opened to supply an $N_2$ gas into the process chamber 201.

By supplying the $O_2$ gas and the $H_2$ gas into the process chamber 201, the $O_2$ gas and the $H_2$ gas are thermally activated (excited) with non-plasma to react under a heated depressurization atmosphere so that active species (oxidizing species) not containing water ($H_2O$) containing oxygen such as atomic oxygen (O) or the like are generated. Then, the oxidization process is performed on the entire Si film mainly by the oxidizing species. Since the energy of the oxidizing species is higher than the bond energy of an Si—Cl bond, an Si—H bond or the like contained in the Si film, the Si—Cl bond, Si—H bond or the like contained in the Si film is separated by providing the energy of the oxidizing species to the Si film. H, Cl or the like separated from the bond to Si is removed from the film and discharged as $Cl_2$, HCl or the like. Furthermore, since the bond to H, Cl or the like is broken, the remaining dangling bond of Si is bonded to O contained in the oxidizing species to form an Si—O bond. In this manner, the Si film formed on the wafer 200 may be entirely changed (modified) to a high quality SiO film with an extremely small content of impurity such as Cl or the like. According to this oxidization process, an oxidizing power can be significantly enhanced, compared with a case where the $O_2$ gas is supplied alone or compared with a case where vapor ($H_2O$ gas) is supplied. That is, by adding the $H_2$ gas to the $O_2$ gas under a depressurization atmosphere, it is possible to obtain the effect of significantly enhancing an oxidizing power, compared with a case where the $O_2$ gas is provided alone or compared with a case where the $H_2O$ gas is supplied.

In addition, at the oxidation step, as described above, it is desirable to not only modify the entire Si film to the SiO film but also slightly oxidize the surface of the underlying wafer 200. Specifically, it is desirable to oxidize the surface of the wafer 200 from an interface with the SiO film (the outermost surface of the wafer 200) to a depth of, for example, 0.05 to 1 nm, specifically 0.1 to 0.5 nm, more specifically 0.2 to 0.5 nm. Accordingly, it is possible to reduce a surface electron trap density between the finally formed SiO film and the wafer 200. In addition, by controlling an oxidation amount of the Si film at the temperature rising step as mentioned above, it is possible to realize such oxidation amount of the wafer 200.

Hereinafter, the processing conditions of the oxidation step will be described. The conditions described herein are the ones under which the entire Si film can be sufficiently oxidized, and are also the ones under which the surface of the underlying wafer 200 can be slightly oxidized.

As described above, the supply flow rate $F_2$ of the $O_2$ gas may be set at a flow rate which is equal to or greater than $F_1$, specifically greater than $F_1$, and may be set, for example, at a flow rate which falls within a range of 500 to 20,000 sccm. The supply flow rate of the $H_2$ gas may be set at a flow rate which falls within a range of, for example, 500 to 20,000 sccm. The supply flow rate of the $N_2$ gas supplied from each gas supply pipe may be set at a flow rate which falls within a range of, for example, 0 to 10,000 sccm.

As described above, the temperature $T_2$ of the wafer 200 may be set at a temperature which falls within a range of, for example, 700 to 1,000 degrees C., specifically 700 to 900 degrees C. The internal pressure $P_2$ of the process chamber 201 may be set at a pressure which falls within a range of, for example, 0.1 to 20 Torr (13.3 to 2,660 Pa), specifically 0.1 to 3 Torr (13.3 to 399 Pa).

If $T_2$ is lower than 700 degrees C. or $P_3$ is less than 0.1 Torr, there may be a case where the quality of the finally formed SiO film as an insulating film is deteriorated, including insufficient insulation properties or etching resistance. Furthermore, there may also be a case where the surface electron trap density between the SiO film and the wafer 200 is increased. These problems can be solved by setting $T_2$ to become 700 degrees C. or higher or by setting $P_3$ to become 0.1 Torr or more.

If $T_2$ exceeds 1,000 degrees C. or $P_3$ exceeds 20 Torr, there may be a case where the oxidizing species generated by a reaction between the $O_2$ gas and the $H_2$ gas are deactivated so that the amount of the oxidizing species supplied to the wafer 200 is insufficient or the oxidation of the Si film is insufficient. In addition, thermal damage to the wafer 200 may be increased. These problems can be solved by setting $T_2$ at 1,000 degrees C. or lower or by setting $P_3$ at 20 Torr or less. These problems can be more reliably solved by setting $T_2$ at 900 degrees C. or lower or by setting $P_3$ at 3 Torr or less.

As the second O-containing gas, it may be possible to use, in addition to the $O_2$ gas, an ozone ($O_3$) gas, an atomic oxygen (O), an oxygen radical (O*), a hydroxyl group radical (OH*) or the like. This gas has an oxidizing power greater than that of the O-containing gas containing N illustrated at the temperature rising step. Thus, by using this gas as the second O-containing gas, it is possible to sufficiently easily oxidize the entire Si film.

As described above, the first O-containing gas and the second O-containing gas may be gases having the same molecular structure (chemical structure) or may be gases having different molecular structures. The case where the first O-containing gas and the second O-containing gas are formed of the same material is desirable in that the structure of the gas supply system can be simplified and the manufacturing cost and maintenance cost of the substrate processing apparatus can be reduced. Furthermore, the case where the first O-containing gas and the second O-containing gas are formed of different materials, for example, the case where a material having an oxidizing power lower than that of the second O-containing gas is used as the first O-containing gas is desirable in that excessive oxidation of the Si film at the temperature rising step can be suppressed and the entire Si film can be sufficiently oxidized at the oxidation step.

As the H-containing gas, it may be possible to use, in addition to $H_2$ gas, a deuterium ($D_2$) gas or the like.

As the inert gas, it may be possible to use, in addition to $N_2$ gas, various kinds of rare gases mentioned above.

(Second after Purge and Atmospheric Pressure Return)

After the entire Si film is modified to the SiO film, the valves 243a and 243b are closed to stop supplying the $O_2$ gas and the $H_2$ gas. Then, the gas or the reaction byproduct, which remains within the process chamber 201, is removed from the interior of the process chamber 201 according to the same processing procedures as those of the aforementioned first after purge (second after purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). The processed wafers 200 are discharged from the boat 217 (wafer discharging).

(3) Effects According to the Present Embodiment

According to the present embodiment, one or more effects set forth below may be achieved.

(a) It is possible to form an SiO film having the excellent step coverage, the in-plane film thickness uniformity and the extremely good surface roughness on the wafer 200.

This is because, at the film forming step of the present embodiment, it is possible to start epitaxial growth on the entire surface of the wafer 200 without delay through the treatment effect by the DCS. As a result, it is possible to form the Si film on the wafer 200 as a film having the excellent step coverage, the in-plane film thickness uniformity, and the extremely good surface roughness. Furthermore, according to the present embodiment, after the film forming step is performed, the temperature rising step is performed under an atmosphere containing the $O_2$ gas. This makes it possible to suppress the cohesion or desorption of Si when the temperature rises, which degrades the surface roughness or the like, by oxidizing the surface of the Si film. As a result, it is possible to maintain the finally formed SiO film with the extremely good surface roughness.

In addition, in the electrode film formed on the SiO film with the good surface roughness, the interface with the SiO film is smoothed. This makes it possible to avoid the local concentration of an electric field generated at the interface with the SiO film when a voltage is applied to the electrode film. Furthermore, the SiO film having the good surface roughness can have a predetermined film thickness or more across the entire in-plane, without a portion having a locally small film thickness. This makes it possible to appropriately use the SiO film formed in the present embodiment as an insulating film having high insulating properties.

(b) By setting the internal pressure $P_2$ of the process chamber 201 at the temperature rising step to become higher than the internal pressure $P_3$ of the process chamber 201 at the oxidation step ($P_2 > P_3$), it is possible to further suppress the thermal etching (desorption of Si) of the Si film at the temperature rising step. As a result, it is possible to more reliably maintain the finally formed SiO film with the extremely good surface roughness. The same effects can be obtained by increasing $P_2$ to become higher than the internal pressure $P_1$ of the process chamber 201 at the film forming step ($P_2 > P_1$).

(c) In the present embodiment, since the surface of the wafer 200 is not directly oxidized but the Si film deposited on the wafer 200 is oxidized, it is possible to suppress spreading of O to the surface of the wafer 200. Furthermore, when only the surface of the Si film is oxidized at the temperature rising step as in the present embodiment, it is possible to merely slightly oxidize the surface of the wafer 200 in the surface oxidation amount at the subsequent oxidation step. That is to say, according to the film forming method of the present embodiment, it is possible to significantly expand a control window of an oxidation amount of the underlying wafer 200 by limiting the oxidation amount of the wafer 200 to a small amount. In contrast, in the thermal oxidation method of directly oxidizing the surface of the wafer 200 or a general alternate supply method of alternately supplying a precursor gas and an oxide gas to the wafer 200, it tends to be difficult to control the oxidation amount of the wafer 200 as mentioned above.

(d) In a case where an Si film is formed through the alternate supply method which non-synchronously performs steps 1 and 2 and the entire film is subsequently oxidized to form an SiO film as in the present embodiment, it is possible to enhance the step coverage, film thickness controllability, in-plane film thickness uniformity or the like of the SiO film, compared with a case where an SiO film is formed through a simultaneous supply method which simultaneously supplies a precursor gas and an oxide gas. This film forming method is effective particularly when the underlying surface of film forming process has a 3D structure such as a line and space shape, a hole shape, a fin shape or the like.

(e) Since the oxidation step is performed at a temperature (second temperature) of, for example, 700 degrees C. or higher, which is higher than the temperature (first temperature) at the time of film formation, it is possible to additionally perform appropriate heat processing on the Si film formed at a relatively low temperature and to finally form the SiO film as a high quality insulating film having high insulating properties or etching resistance. Furthermore, it is possible to reduce a surface electron trap density between the SiO film and the wafer 200 through this heat processing. In addition, when the surface of the wafer 200 is slightly oxidized at the oxidation step, it is possible to further reduce the surface electron trap density between the SiO film and the wafer 200, compared with a case where the surface of the wafer 200 is not oxidized.

(f) Since the oxidation process is performed using the oxidizing species having an extremely high oxidizing power generated through a reaction between the $O_2$ gas and the $H_2$ gas at the oxidation step, it is possible to sufficiently oxidize the entire Si film and to form the finally obtained SiO film as a high quality insulating film with extremely less content of impurity and extremely high insulating properties or etching resistance.

(g) Since a series of steps from the film forming step to the oxidation step are performed in-situ within the same process chamber 201, the wafer 200 is not exposed to the air in the course of substrate processing and it is possible to consistently perform the substrate processing with the wafer 200 left in a vacuum state. As a result, it is possible to perform the substrate processing in a clean state and to precisely control the oxidation amount, and also to perform the film forming process with high precision and high quality. In addition, by performing the series of steps in-situ, it is possible to limit the number of required substrate processing apparatuses and to reduce the substrate processing cost.

In contrast, when the film forming step and the oxidation step are performed ex-situ in different process chambers, there may be a case where the wafer 200 is exposed to the air in the course of the substrate processing, i.e., before the oxidation step starts after the film forming step is completed, resulting in natural oxidation or contamination of the surface of the Si film. Furthermore, when the surface of the Si film is RCA-cleansed before the oxidation step is performed, there may also be a case where an oxide film containing a component of an RCA cleansing solution is formed on the surface of the Si film. Since it is difficult to control the thickness and quality of the oxide film, it may be necessary to perform HF-cleansing on the surface of the Si film before the oxidation step is performed. According to the present embodiment, it is not necessary to perform such a cleansing step and it is possible to avoid the degradation of productivity of substrate processing.

(h) The effects mentioned above can be similarly achieved in the case where a halosilane precursor gas other than the DCS gas is used as the first precursor gas, or in the case where a silicon hydride gas other than the DS gas is used as the second precursor gas, in the case where an O-containing gas other than the $O_2$ gas is used as the first and second O-containing gases, or in the case where an H-containing gas other than the $H_2$ gas is used as the H-containing gas.

(4) Exemplary Modifications

The substrate processing sequence of the present embodiment is not limited to the aforementioned one but may be modified as in the modifications described below.

Modification 1

As described above, the supply of the $O_2$ gas at the temperature rising step may start before or after the temperature of the wafer 200 starts to rise after completion of the film forming step. Furthermore, the supply of the $O_2$ gas at the temperature rising step may be kept until the temperature rising of the wafer 200 is completed or may be stopped before the temperature rising of the wafer 200 is completed.

In addition, the case where the supply of the $O_2$ gas starts before the temperature of the wafer 200 starts to rise or is kept until the temperature rising of the wafer 200 is completed is preferable in that the surface of the Si film is more reliably oxidized before the temperature rises to more reliably suppress the cohesion or desorption of Si. Moreover, the case where the supply of the $O_2$ gas starts after the temperature of the wafer 200 starts to rise or is stopped before the temperature rising of the wafer 200 is completed is preferable in that excessive oxidation of the Si film can be suppressed and only the surface of the Si film can be easily oxidized.

Modification 2

At the temperature rising step, the supply of the $O_2$ gas to the wafer 200 may be intermittently performed a predetermined number of times. According to this modification, it is possible to more appropriately suppress the oxidation of the Si film. Furthermore, it is also possible to precisely control the oxidation amount of the surface of the Si film by adjusting the number of times of supply of the $O_2$ gas.

Modification 3

The temperature rising step may be performed under an atmosphere containing a mixture of the $O_2$ gas and an $N_2O$ gas. Since the $N_2O$ gas has an oxidizing power lower than that of the $O_2$ gas, it is possible to more appropriately suppress the oxidation of the Si film by performing the temperature rising step under the atmosphere of the mixture gas than in the case where the temperature rising step is performed under the atmosphere of the $O_2$ gas. Furthermore, it is possible to precisely control the oxidation amount of the surface of the Si film by adjusting a mixture ratio of each gas, i.e., a ratio of a partial pressure of each gas within the process chamber 201.

Modification 4

At the temperature rising step, the supply of the $O_2$ gas to the wafer 200 and the supply of the NO gas to the wafer 200 may be alternately performed a predetermined number of times. Even in this case, the same effects as those of modification 2 or modification 3 may be achieved.

Modification 5

At the temperature rising step, the supply of the $O_2$ gas to the wafer 200 may be continuously performed and the supply of the $N_2O$ gas to the wafer 200 may be intermittently performed a predetermined number of times. Furthermore, at the temperature rising step, the supply of the $N_2O$ gas to the wafer 200 may be continuously performed and the supply of the $O_2$ gas to the wafer 200 may be intermittently performed a predetermined number of times. In either case, the same effects as those of modification 2 or modification 3 may be achieved.

Modification 6

The Si film to be oxidized may be formed by simultaneously supplying a DCS gas and a DS gas. Furthermore, the Si film may be formed by intermittently repeating this simultaneous supply a predetermined number of times. In addition, the Si film may be formed by continuously supplying the DS gas or intermittently supplying the DS gas without using the DCS gas. Moreover, the Si film may be formed by forming an Si layer (seed layer) having a predetermined thickness by alternately supplying the DCS gas and the DS gas and subsequently supplying an MS gas. Even in this modification, by setting various processing conditions to become similar to those of the substrate processing sequence illustrated in FIGS. 4 and 5, the same effects as those of the substrate processing sequence illustrated in FIGS. 4 and 5 may be achieved.

Modification 7

As the first precursor gas, it may be possible to use a halosilane precursor gas having an Si—C bond, such as a 1,1,2,2-tetrachloro-1,2-dimethyldisilane ($(CH_3)_2Si_2C$, abbreviation: TCDMDS) gas and a bis-tri-chlorosilylmethane ($(SiCl_3)_2CH_2$, abbreviation: BTCSM) gas or the like. Even in this modification, by setting various processing conditions to become similar to those of the substrate processing sequence illustrated in FIGS. 4 and 5, the same effects as those of the substrate processing sequence illustrated in FIGS. 4 and 5 may be achieved. Furthermore, according to this modification, it is possible to dope an extremely small amount of C in the SiO film.

Modification 8

As the first precursor gas, it may be possible to use a fluorosilane precursor gas such as a tetrafluorosilane ($SiF_4$) gas or the like, a bromosilane precursor gas such as a tetrabromosilane ($SiBr_4$) gas or the like, or an iodosilane precursor gas such as a tetraiodosilane ($SiI_4$) gas or the like. Even in this modification, by setting various processing conditions to become similar to those of the substrate processing sequence illustrated in FIGS. 4 and 5, the same effects as those of the substrate processing sequence illustrated in FIGS. 4 and 5 may be achieved.

Modification 9

As the first precursor gas, it may be possible to use a halogen-based gas not containing Si, such as a hydrogen chloride (HCl) gas, a chlorine ($Cl_2$) gas, a boron chloride ($BCl_3$) gas, a chlorine trifluoride ($ClF_3$) or the like. Even in this modification, by setting various processing conditions to become similar to those of the substrate processing sequence illustrated in FIGS. 4 and 5, the same effects as those of the substrate processing sequence illustrated in FIGS. 4 and 5 may be achieved.

Modification 10

As the second precursor gas, it may be possible to use a silazane precursor gas such as a hexamethyldisilane ($[(CH_3)_3Si]_2NH$) gas, a tetramethyldisilazane ($[H(CH_3)_2Si]_2NH$) gas, a hexachlorodisilazane (($Cl_3Si)_2NH$) gas, a tetrachlorodisilazane (($HCl_2Si)_2NH$) gas or the like. Even in this modification, by setting various processing conditions to become similar to those of the substrate processing sequence illustrated in FIGS. 4 and 5, the same effects as those of the substrate processing sequence illustrated in FIGS. 4 and 5 may be achieved. Furthermore, according to this modification, it is possible to dope an extremely small amount of N in the SiO film.

Modification 11

As the second precursor gas, it may be possible to use an aminosilane precursor gas such as a butylaminosilane (BAS) gas, a bis-tert-butylaminosilane (BTBAS) gas, a dimethylaminosilane (DMAS) gas, a bis-dimethylaminosilane (BDMAS) gas, a tris-dimethylaminosilane (3DMAS) gas, a diethylaminosilane (DEAS) gas, a bis-diethylaminosilane (BDEAS) gas, a dipropylaminosilane (DPAS) gas, a diisopropylaminosilane (DIPAS) gas or the like. Even in this modification, by setting various processing conditions to become similar to those of the substrate processing sequence illustrated in FIGS. 4 and 5, the same effects as those of the substrate processing sequence illustrated in FIGS. 4 and 5 may be achieved. Furthermore, according to this modification, it is possible to dope an extremely small amount of C and N in the SiO film.

Modification 12

As the first precursor gas, it may be possible to use a siloxane precursor gas such as a hexachlorodisiloxane (($Cl_3Si)_2O$) gas, a tetrachlorodisiloxane (($HCl_2Si)_2O$) gas or the like. Furthermore, as the second precursor gas, it may be possible to use a siloxane precursor gas such as a hexamethyldisiloxane ($[(CH_3)_3Si]_2O$) gas, a tetramethyldisiloxane ($[H(CH_3)_2Si]_2O$) gas or the like. Even in this modification, by setting various processing conditions to become similar to those of the substrate processing sequence illustrated in FIGS. 4 and 5, the same effects as those of the substrate processing sequence illustrated in FIGS. 4 and 5 may be achieved.

Other Embodiments of Present Disclosure

While one embodiment of the present disclosure has been specifically described above, the present disclosure is not limited to the aforementioned embodiment but may be differently modified without departing from the spirit of the present disclosure.

Recipes used in substrate processing may be prepared individually according to the processing contents and may be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace.

In the embodiment or the modifications described above, there has been described an example in which an oxide film containing Si as a main element is formed on the substrate, but the present disclosure is not limited thereto. That is, the present disclosure may be suitably applied to a case where an oxide film containing a semi-metal element such as germanium (Ge), B or the like, other than Si, as a main element is formed on the substrate. Furthermore, the present disclosure may be suitably applied to a case where an oxide film containing, as a major element, a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al) or the like is formed on the substrate.

The embodiment and modifications described above may be appropriately combined with one another. The processing conditions used at this time may be similar to, for example, the processing conditions of the aforementioned embodiment.

EXAMPLES

Hereinafter, experiment results supporting the effects achieved in the aforementioned embodiment will be described.

In sample 1, the substrate processing apparatus illustrated in FIG. 1 was used and an Si film was formed on a wafer according to the film forming sequence illustrated in FIG. 4. Thereafter, a temperature rising step and an oxidation step were sequentially performed according to the substrate processing sequence illustrated in FIG. 5 to modify the entire Si film formed on the wafer to an SiO film. An $O_2$ gas was used as a first O-containing gas, an $O_2$ gas was used as a second O-containing gas, and an $H_2$ gas was used as an H-containing gas. The processing conditions at each step were the ones within the range of the processing conditions described in the aforementioned embodiment. The film forming step, the temperature rising step, and the oxidation step were continuously performed within the same process chamber without performing a step of unloading the wafer from the interior of the process chamber between those steps.

In sample 2, an Si film was formed on a wafer under the same processing procedures and processing conditions as those used when producing sample 1. Thereafter, a temperature rising step and an oxidation step were sequentially performed according to the substrate processing sequence illustrated in FIG. 5 to modify the Si film formed on the wafer to an SiO film. At the temperature rising step, the supply of the $O_2$ gas to the wafer was not performed. Other processing procedures and processing conditions may be similar to those used when producing sample 1.

Figure 7:
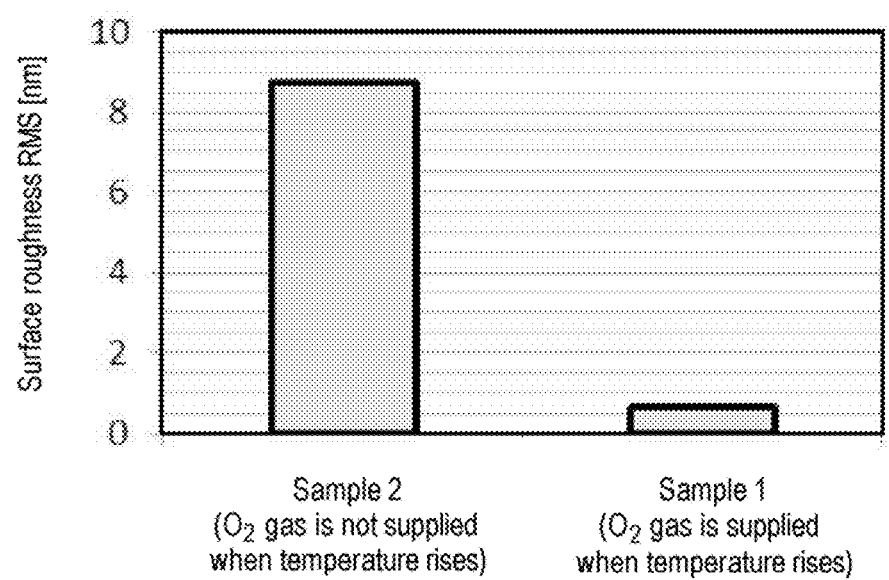
FIG. 7 is a diagram illustrating evaluation results of the surface roughness of an SiO film.
Figure 8A:
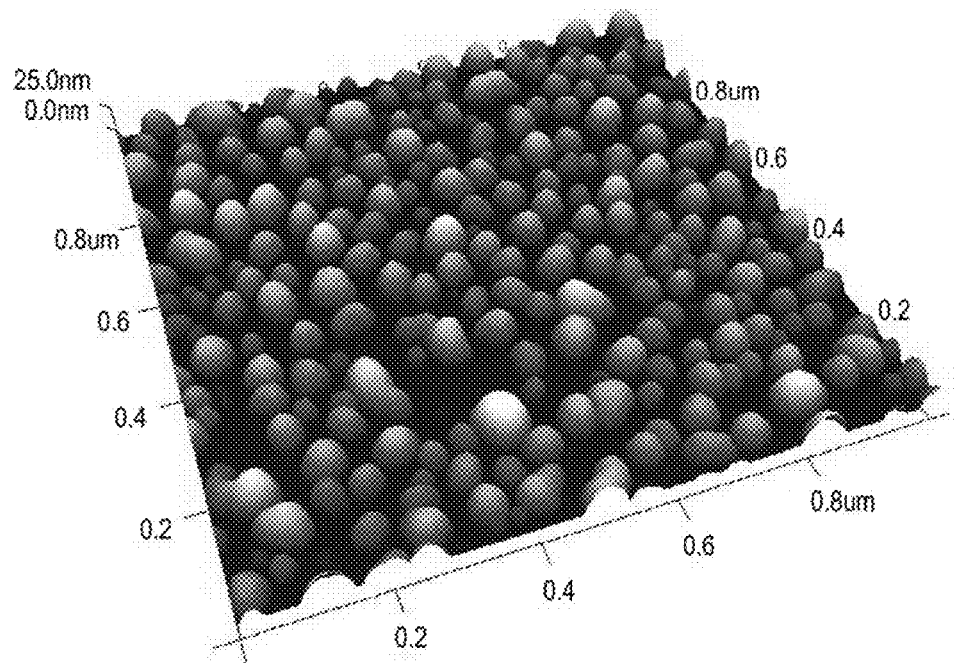
FIGS. 8A and 8B are views illustrating AFM images of the surface of the SiO film.
Figure 8B:
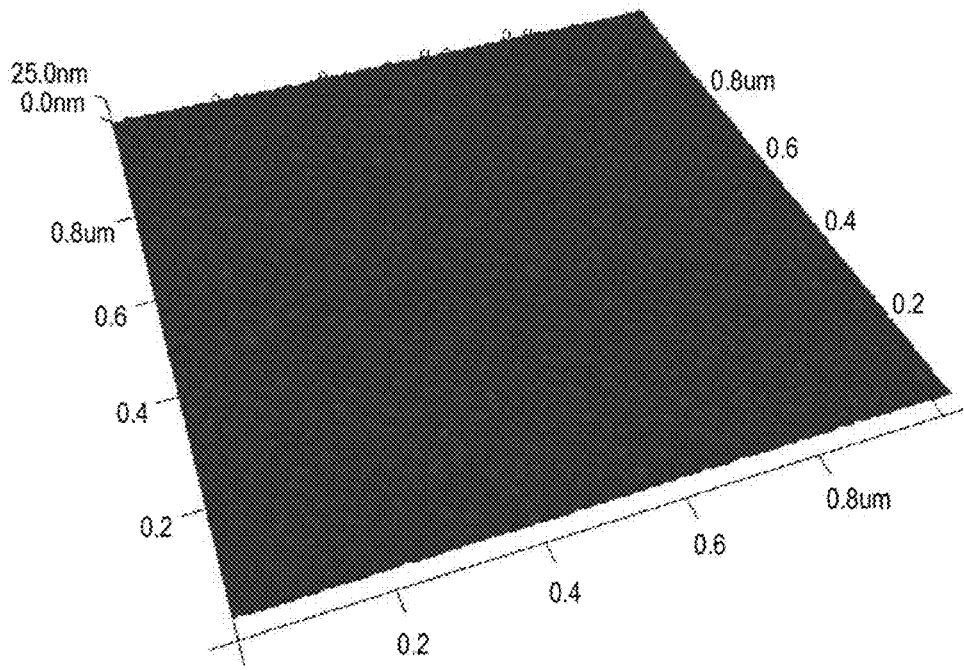

Then, the surface roughness (RMS) of each film of samples 1 and 2 was measured using an atomic force microscope (AFM). Here, RMS refers to a root mean square roughness, and indicates that the smaller the value, the more the surface roughness of the SiO film is good, i.e., the more the surface of the SiO film is smoothed. FIG. 7 is a graph illustrating measurement results of RMS of the SiO film, in which the vertical axis represents RMS [nm] and the horizontal axis represents samples 2 and 1 in order. FIG. 8A illustrates an AFM image of the surface of the SiO film of sample 2 and FIG. 8B illustrates an AFM image of the surface of the SiO film of sample 1.

According to these drawings, RMS of sample 1 in which the Or gas was supplied at the temperature rising step is smaller by 10 times or more than that of sample 2 in which the $O_2$ gas was not supplied at the temperature rising step (the surface is smoothed). $O_2$ gas supplied at the temperature rising step when producing sample 1 acted to suppress the cohesion or desorption of Si.

Aspects of the Present Disclosure

Hereinafter, some aspects of the present disclosure will be additionally stated as supplementary notes.
(Supplementary Note 1)

According to one aspect of the present disclosure, there is provided a method of manufacturing a semiconductor device or a substrate processing method, including forming a film containing a predetermined element on a substrate by supplying a precursor containing the predetermined element to the substrate having a first temperature in a process chamber, changing a temperature of the substrate to a second temperature higher than the first temperature under an atmosphere containing a first oxygen-containing gas in the process chamber, and oxidizing the film while maintaining the temperature of the substrate at the second temperature under an atmosphere containing a second oxygen-containing gas in the process chamber.
(Supplementary Note 2)

In the method of Supplementary Note 1, the second temperature may be a temperature at which at least one of a migration of the predetermined element contained in the film and a desorption of the predetermined element from the film is outstandingly generated under an atmosphere not containing the first oxygen-containing gas.

(Supplementary Note 3)

In the method of Supplementary Note 1 or 2, an internal pressure (second pressure) of the process chamber in the act of changing the temperature of the substrate may be set to be higher than an internal pressure (third pressure) of the process chamber in the act of oxidizing the film.

(Supplementary Note 4)

In the method of any one of Supplementary Notes 1 to 3, the internal pressure (second pressure) of the process chamber in the act of changing the temperature of the substrate may be set to be higher than an internal pressure (first pressure) of the process chamber in the act of forming the film.

(Supplementary Note 5)

In the method of S any one of Supplementary Notes 1 to 4, the act of oxidizing the film may include a period in which the second oxygen-containing gas and a hydrogen-containing gas are simultaneously supplied to the substrate.

(Supplementary Note 6)

In the method of any one of Supplementary Notes 1 to 5, the first oxygen-containing gas and the second oxygen-containing gas may have the same molecular structure.

(Supplementary Note 7)

In the method of any one of Supplementary Notes 1 to 5, the first oxygen-containing gas and the second oxygen-containing gas may have different molecular structures.

(Supplementary Note 8)

In the method of Supplementary Note 7, an oxidizing power of the first oxygen-containing gas may be smaller than an oxidizing power of the second oxygen-containing gas.

(Supplementary Note 9)

In the method of Supplementary Note 8, the first oxygen-containing gas may contain nitrogen, and the second oxygen-containing gas may not contain nitrogen.

(Supplementary Note 10)

In the method of Supplementary Note 9, the first oxygen-containing gas may include at least one selected from a group consisting of nitrous oxide, nitrogen monoxide, and nitrogen dioxide, and the second oxygen-containing gas may include at least one selected from a group consisting of oxygen, ozone, atomic oxygen, oxygen radical, and hydroxyl radical.

(Supplementary Note 11)

In the method of any one of Supplementary Notes 1 to 10, a supply flow rate (first flow rate) of the first oxygen-containing gas in the act of changing the temperature of the substrate may be set to be equal to or smaller than a supply flow rate (second flow rate) of the second oxygen-containing gas in the act of oxidizing the film. Specifically, the first flow rate may be set to be smaller than the second flow rate.

(Supplementary Note 12)

In the method of any one of Supplementary Notes 1 to 11, a surface of the film may be oxidized while an entire portion of the film is not oxidized in the act of changing the temperature of the substrate, and the entire portion of the film may be oxidized in the act of oxidizing the film.

(Supplementary Note 13)

In the method of Supplementary Note 12, the film may be oxidized from an uppermost surface of the film to a depth of 0.05 to 1 nm, specifically 0.1 to 0.5 nm, more specifically 0.2 to 0.5 nm in the act of changing the temperature of the substrate.

(Supplementary Note 14)

In the method of Supplementary Note 12 or 13, the entire portion of the film and a surface of an underlying layer of the film may be oxidized in the act of oxidizing the film.

(Supplementary Note 15)

In the method of Supplementary Note 14, the underlying layer may be oxidized from an interface between the underlying layer and the film to a depth of 0.05 to 1 nm, specifically 0.1 to 0.5 nm, more specifically 0.2 to 0.5 nm in the act of oxidizing the film.

(Supplementary Note 16)

In the method of any one of Supplementary Notes 1 to 15, a silicon hydride may be used as the precursor. More preferably, a disilane may be used as the precursor.

(Supplementary Note 17)

According to another aspect of the present disclosure, there is provided a substrate processing apparatus, including a process chamber configured to accommodate a substrate, a supply system configured to supply a precursor containing a predetermined element, a first oxygen-containing gas, and a second oxygen-containing gas to the substrate in the process chamber, a heating mechanism configured to heat the substrate in the process chamber, and a control part configured to control the supply system and the heating mechanism to perform the process of Supplementary Note 1.

(Supplementary Note 18)

According to a further aspect of the present disclosure, there is provided a program or a non-transitory computer-readable recording medium storing the program that causes, by a computer, a substrate processing apparatus to perform the process of Supplementary Note 1.

According to the present disclosure in some embodiments, it is possible to improve a quality of an oxide film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or the modifications as would fall within the scope and spirit of the disclosures.

What is claimed is:

1. A method of manufacturing a semiconductor device, comprising:
    (a) forming a film containing a predetermined element on a substrate having a first temperature in a process chamber by performing a cycle a predetermined number of times, the cycle including alternately performing:
        supplying a first precursor containing the predetermined element and a halogen element to the substrate; and
        supplying a second precursor containing the predetermined element and not containing the halogen element to the substrate;
    (b) changing a temperature of the substrate to a second temperature that is higher than the first temperature under an atmosphere containing a first oxygen-containing gas in the process chamber; and
    (c) oxidizing the film while maintaining the temperature of the substrate at the second temperature under an atmosphere containing a second oxygen-containing gas in the process chamber.

2. The method of claim 1, wherein the second temperature is a temperature at which at least one of a migration of the predetermined element contained in the film and a desorption of the predetermined element from a surface of the film is outstandingly generated under an atmosphere not containing the first oxygen-containing gas.

3. The method of claim 1, wherein an internal pressure of the process chamber in the act of (b) is set to be higher than an internal pressure of the process chamber in the act of (c).

4. The method of claim 3, wherein the internal pressure of the process chamber in the act of (b) is set to be higher than an internal pressure of the process chamber in the act of (a).

5. The method of claim 1, wherein an internal pressure of the process chamber in the act of (b) is set to be higher than an internal pressure of the process chamber in the act of (a).

6. The method of claim 1, wherein the act of (c) includes a period in which the second oxygen-containing gas and a hydrogen-containing gas are simultaneously supplied to the substrate.

7. The method of claim 1, wherein the first oxygen-containing gas and the second oxygen-containing gas have the same molecular structure.

8. The method of claim 1, wherein the first oxygen-containing gas and the second oxygen-containing gas have different molecular structures.

9. The method of claim 8, wherein an oxidizing power of the first oxygen-containing gas is smaller than an oxidizing power of the second oxygen-containing gas.

10. The method of claim 9, wherein the first oxygen-containing gas contains nitrogen, and the second oxygen-containing gas does not contain nitrogen.

11. The method of claim 10, wherein the first oxygen-containing gas includes at least one selected from a group consisting of nitrous oxide, nitrogen monoxide, and nitrogen dioxide, and the second oxygen-containing gas includes at least one selected from a group consisting of oxygen, ozone, atomic oxygen, oxygen radical, and hydroxyl radical.

12. The method of claim 1, wherein a supply flow rate of the first oxygen-containing gas in the act of (b) is set to be equal to or smaller than a supply flow rate of the second oxygen-containing gas in the act of (c).

13. The method of claim 1, wherein a supply flow rate of the first oxygen-containing gas in the act of (b) is set to be smaller than a supply flow rate of the second oxygen-containing gas in the act of (c).

14. The method of claim 1, wherein a surface of the film is oxidized while an entire portion of the film is not oxidized in the act of (b), and the entire portion of the film is oxidized in the act of (c).

15. The method of claim 14, wherein the film is oxidized from an uppermost surface of the film to a depth of 0.05 to 1 nm in the act of (b).

16. The method of claim 14, wherein the entire portion of the film and a surface of an underlying layer of the film are oxidized in the act of (c).

17. The method of claim 16, wherein the underlying layer is oxidized from an interface between the underlying layer and the film to a depth of 0.05 to 1 nm in the act of (c).

18. The method of claim 1, wherein a silicon hydride is used as the second precursor.

* * * * *